(12) United States Patent
Kranz

(10) Patent No.: US 7,355,472 B2
(45) Date of Patent: Apr. 8, 2008

(54) METHOD AND DEVICE FOR CORRECTING SIGNAL DISTORTIONS IN AN AMPLIFIER DEVICE

(75) Inventor: Christian Kranz, Ratingen Lintorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/536,653

(22) PCT Filed: Oct. 28, 2003

(86) PCT No.: PCT/EP03/11954

§ 371 (c)(1),
(2), (4) Date: May 30, 2006

(87) PCT Pub. No.: WO2004/049560

PCT Pub. Date: Jun. 10, 2004

(65) Prior Publication Data

US 2007/0008031 A1    Jan. 11, 2007

(30) Foreign Application Priority Data

Nov. 27, 2002   (DE) ................ 102 55 352

(51) Int. Cl.
*H03F 3/38* (2006.01)
(52) U.S. Cl. ............... 330/10; 330/146; 330/149; 330/207 A; 330/251

(58) Field of Classification Search ............... 330/10, 330/146, 149, 207 A, 251
See application file for complete search history.

(56) References Cited

U.S. PATENT DOCUMENTS

| | | | |
|---|---|---|---|
| 6,124,757 | A | 9/2000 | Newey |
| 6,278,301 | B1 | 8/2001 | Jones, III et al. |
| 6,518,838 | B1 | 2/2003 | Risbo |
| 6,768,779 | B1 | 7/2004 | Nielsen |

FOREIGN PATENT DOCUMENTS

| | | |
|---|---|---|
| WO | WO 98/44626 | 10/1998 |
| WO | WO 99/45641 A1 | 9/1999 |
| WO | WO 2004/049560 A1 | 6/2004 |

OTHER PUBLICATIONS

Logan et al., "Linearization of Class D Output Stages for High-Performance Audio Power Amplifiers." Second International Conference on Advanced A-D and D-A Conversion Techniques and their Applications. IEE. Cambridge. Jun. 1994. pp. 136-141, (6 pages).

Tan et al., "A Novel Self-Error Correction Pulse Width Modulator for a Class D Amplifier for Hearing Instruments", IEEE International Symposium on Circuits and Systems, May 1998, pp. 261-264, (4 pages).

*Primary Examiner*—Michael B. Shingleton
(74) *Attorney, Agent, or Firm*—Maginot, Moore & Beck

(57) ABSTRACT

The present invention provides a method for the correction of signal distortions in an amplifier device, wherein a digital PWM modulator is operated with a variable-frequency system clock. The present invention likewise provides a device for the correction of signal distortions in an amplifier device.

20 Claims, 2 Drawing Sheets

METHOD AND DEVICE FOR CORRECTING SIGNAL DISTORTIONS IN AN AMPLIFIER DEVICE

BACKGROUND

The present invention relates to a method and a device for the correction of signal distortions in an amplifier device, and in particular to a method and a device for the correction of signal distortions in a driver circuit of a class-D power amplifier.

A pulse-width-modulated signal (PWM signal) has its signal information in the pulse width and not in the amplitude. Therefore, generally switches, such as for example relays, switching transistors, thyristors or triacs, are used for the amplification of a PWM signal. The switching devices thereby switch a load alternately between two potentials, generally of a supply voltage and a reference potential, such as for example ground, the-time duration of the switched-on and switched-off state being determined by means of the pulse width.

However, switches of this type do not have an ideal switching behavior, i.e. errors occur, caused by the switching itself, such as for example switching delays, rise times and fall times (timing error). In addition, the supply voltage represents a further source of errors (power supply error), since interference voltages on the supply voltage have a direct effect on the output signals of the amplifier device. In addition, the load switched by means of the switching device or amplifier device itself disturbs the supply voltage.

In class-D power amplifiers, a pulse-width-modulated (PWM) signal is raised in the level of its voltage and/or current, i.e. amplified, in order to produce a signal for the direct or prefiltered driving of a load with a low impedance, such as e.g. a loudspeaker in audio applications. Although the input PWM signal can be produced digitally with very high quality, as far as distortions and/or the signal-to-noise ratio are concerned, the output stage has limitations in this respect. It is neither possible to produce a perfectly digitally switching driver stage nor is it possible to provide a power supply for the driver stage without distortions in the output voltage.

In practice this means that a correction circuit is required for correcting the errors which are caused by the power stage.

In WO 98/44626 a description is given of a feedback method which adapts the pulse width of a PWM signal directly and continuously over time, and thereby reduces the errors of the driver stage. A controlled variable thereby directly controls a correction unit in which the pulse width is changed as a linear function. No allowance is made there for the fact that the influence of the controlled variable on the output signal is dependent on the pulse width of the PWM signal at the time, i.e. a constant timing correction for small pulse widths brings about a considerably greater effect than for greater pulse widths. In practice this means that the controller must constantly readjust the pulse width, to be precise in addition to the error that is actually to be corrected. Such constant readjustment can in turn lead to interference signals and is consequently to be reduced or avoided as far as possible.

In the conference publication No. 393 by S. Logan, M. O. J. Hawksford "Linearization of Class D Output Stages for High Performance Audio Power Amplifiers" of the conference on Advanced A-D and D-A Compression Techniques and Their Application, Jul. 6 to 8, 1994, a description is given of a method in which the pulse width can be readjusted by a delay line with discrete taps. The control itself also takes place in this case by means of a feedback loop. The main difference in comparison with WO 98/44626 is, however, that in WO 98/44626 the pulse width is set continuously and in the conference article it is set in discrete stages.

WO 00/46919 describes a method in which the errors of the amplifier bridge are corrected digitally, i.e. before the actual PWM modulator. A disadvantage of this method is restricted accuracy, i.e. the smallest readjustment stage is determined by the resolution of the PWM modulator. In addition, there is the disadvantage that an A-D converter is required for digitizing the error.

In WO 99/45641 a description is given of a method in which the pulse width difference between an input signal and an output signal of the output stage is used as a controlled variable for correction. A disadvantage of this method is attributable to the fact that only timing errors of the driver circuit can be picked up in this way. According to the publication, controlling of the pulse width takes place by means of changing the amplitude of a triangular reference signal.

SUMMARY

It is therefore the object of the present invention to provide a method and a device for the correction of signal distortions in an amplifier device by which all the aforementioned errors which can occur in a driver circuit are reduced by a feedback control circuit.

The idea on which the invention is based is essentially that a pulse-width-dependent correction signal is provided by means of controlling the system clock frequency of a digital PWM modulator. With this correction signal, the likewise pulse-width-dependent influence of disturbances on the power supply can be controlled in such a way that the pulse width dependence thereof is reduced. An additional additive correction signal allows the pulse width dependence to be eliminated completely.

Alternatively, a multiplicative correction is possible, for example by means of a second PWM modulator. Theoretically, a compensation for signal-correlated disturbances on the power supply can also be envisaged. This makes it possible to realize a pulse-width-independent control circuit for the correction of disturbances on the supply voltage. That is to say that, by contrast with the prior art, the control circuit only has to correct the errors actually occurring in the driver circuit and the power supply. Accordingly, either the dynamic requirement needed for the error compensation can be reduced or the correction range can be increased in comparison with previous solutions. All these properties have a positive effect on the achievable audio quality and a power saving.

In the present invention, the problem mentioned at the beginning is solved in particular by providing a method for the correction of signal distortions in an amplifier device, with the steps of: producing a digital pulse-width-modulated reference signal from pulse-width-modulated data in a first pulse width modulator, which is controlled with a predetermined system clock and triggered at a predetermined PWM pulse rate; producing a digital pulse-width-modulated signal from the pulse-width-modulated data in a second pulse width modulator, which is controlled with a variable-frequency system clock and triggered at the predetermined PWM pulse rate; amplifying the digital PWM signal in the amplifier device; determining an amplifier deviation from the digital PWM reference signal and the amplified digital PWM signal; producing a controlled variable from the amplifier deviation in a control device; feeding the controlled variable to a control input of a variable-frequency device; and producing the variable-frequency system clock in the variable-frequency device.

Advantageous developments and improvements of the respective subject matter of the invention can be found in the subclaims.

According to a preferred development, the pulse-width-modulated data are produced from a digital signal in a digital circuit.

According to a further preferred development, the PWM data are produced in the digital circuit from the digital signal, preferably a PCM-modulated digital audio signal, in such a way that with each clock of the predetermined PWM pulse rate a quantized item of PWM information is calculated, i.e. high-level pulse length and low-level pulse length in quantized form.

According to a further preferred development, the variable-frequency device is a VCO or CCO (voltage controlled oscillator or current controlled oscillator), which is preferably likewise synchronized with the predetermined PWM pulse rate.

According to a further preferred development, the digital PWM reference signal and/or the amplified digital PWM signal pass(es) through a filter device before the amplifier deviation is determined.

According to a further preferred development, the amplifier device is designed with an H-bridge circuit and/or as a class-D amplifier.

According to a further preferred development, the control device is designed in such a way that the controlled variable sets the frequency of the variable-frequency device such that the difference between the digital PWM reference signal and the amplified digital PWM signal becomes minimal.

According to a further preferred development, the amplified digital PWM signal is fed to an acoustic sound transducer, preferably via a filter device, such as in particular a low-pass filter.

According to a further preferred development, a filtered loudspeaker signal, preferably filtered via a further filter device, is likewise used for determining the amplifier deviation from the digital PWM reference signal and the amplified digital PWM signal.

According to a further preferred development, the variable-frequency system clock is compared with the predetermined system clock in a phase detector, in order to determine a phase difference, which is filtered in a filter device and then added to the controlled variable.

According to a further preferred development, the variable-frequency system clock is compared with the predetermined system clock in a phase detector, in order to determine a phase difference, which is added to the controlled variable and filtered in an additional filter device, in order to be applied to the control input of the variable-frequency device.

According to a further preferred development, the phase difference of the variable-frequency device, preferably a VCO, is fed via a modulation input.

According to a further preferred development, the frequency of the variable-frequency system clock of the digital PWM modulator is varied at discrete times.

According to a further preferred development, the frequency of the variable-frequency system clock of the digital PWM modulator is varied continuously over time.

In the PWM modulation, various types of modulation are used. Both a single-edge modulation (trailing edge, leading edge) and a double-edge modulation (double edge, differential double edge) can be used, it being possible for the present invention to be applied to all these types of modulation.

The driver circuit or amplifier device itself may also be realized both as single-ended in the form of an inverter and in a differential form as a bridge, i.e. what is known as an H-bridge.

BRIEF DESCRIPTION OF THE DRAWINGS

Exemplary embodiments of-the invention are explained in more detail in the following description and are represented in the drawings, in which.

DESCRIPTION

Figure 1:
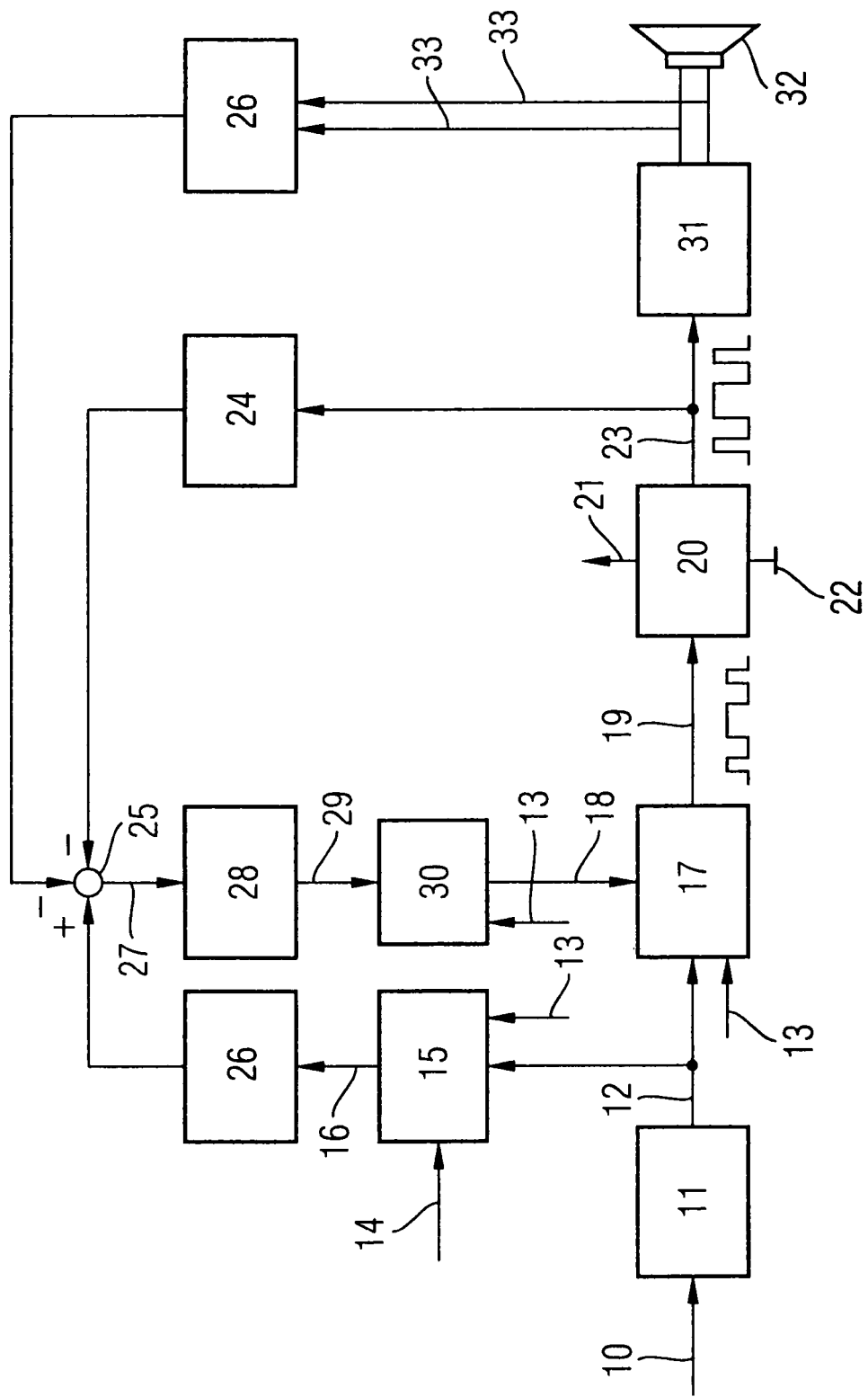
FIG. 1 shows a schematic block diagram of a control circuit to explain a first embodiment of the present invention.

In the drawings, the same reference numerals designate component parts that are the same or functionally the same.

In a schematic block diagram according to FIG. 1, a signal 10, preferably a digital audio signal, is converted in a signal processing device 11 into PWM data or PWM information, i.e. high-level pulse lengths and low-level pulse lengths in quantized form. The signal processing device 11 is preferably a digital circuit and calculates PWM data 12 from the preferably PCM-coded digital audio signals 10. The PWM data 12 preferably have the property that they are calculated in such a way that a quantized item of pulse width information is calculated with every clock of the PWM pulse rate 13. In the present exemplary embodiment according to FIG. 1, the PWM pulse rate 13 is, for example, 288 kHz, and a predetermined system clock 14 has a frequency of 88.128 MHz.

A first PWM modulator 15 produces a digital PWM reference signal 16 from the PWM data 12, the PWM modulator 15 being controlled with a constant predetermined system clock 14. The constant predetermined system clock 14 is preferably produced by means of a quartz oscillator or a quartz oscillator with a classic PLL (phase locked loop) (not represented). The PWM pulse rate 13 serves for triggering the PWM modulator 15. Various types of modulation may be used in the PWM modulator 15 to produce the digital PWM reference signal 16. In the case of a trailing-edge modulation, for example, the PWM modulator 15 comprises a simple counter, which is preloaded with the PWM datum 12 at the beginning of the pulse period (PRR) and is then counted down with the predetermined system clock 14 until the counter reading zero is reached. The digital PWM reference signal 16 is then e.g. the counter not equal to zero. The possible number of pulse width stages is prescribed by the PWM pulse rate 13 and the predetermined system clock 14 and in this example is 88128/288=306 stages. Some of these 306 stages must be reserved for the pulse width control, so that e.g. only 256 stages must be calculated as digitally effective (e.g. in the range 25 to 281).

A second PWM modulator 17 is preferably constructed in substantially the same manner as the first PWM modulator 15, but is controlled with a variable-frequency system clock 18 and produces a digital PWM signal 19 from the PWM data 12. As also in the case of the first PWM modulator 15, in the case of the second PWM modulator 17 the PWM modulation method can be set, and is set for example to trailing edge. The second PWM modulator 17 is also synchronized to the PWM pulse rate 13. The digital pulse-width-modulated signal 19 is then amplified in an amplifier device 20, which is connected to a supply voltage 21 and a reference voltage 22, e.g. ground. The amplifier device 20 or power stage is preferably configured as an H-bridge.

The amplified digital PWM signal 23 is then preferably filtered in a first filter device 24 and fed to a summation device 25 or a summation node in the same way as the reference signal 16, preferably likewise filtered in a second filter device 26. The first filter device 24 has in this case a transfer function $G_0(f)$ and the second filter device 26 has a transfer function $G_r(f)$. In the summation device 25, a subtraction is preferably performed, the preferably filtered amplified digital PWM signal 23 being subtracted from the preferably filtered digital PWM reference signal 16. In the summation device 25, consequently, an amplifier deviation 27 or an amplifier error is determined, and this is converted into a controlled variable 29 in a control device 28, for example with a transfer function $G_c(f)$. This controlled variable 29 is then fed to a variable-frequency device 30, for example a VCO (voltage controlled oscillator) or a CCO (current controlled oscillator), to the control input thereof. In the variable-frequency device 30, e.g. a VCO, the variable-frequency system clock 18 is then produced. Consequently, the second PWM modulator 17 is operated with the controlled clock 18.

To avoid jitter of the PWM pulse by up to a period of the clock of the variable-frequency device 30, the variable-frequency device 30 can also preferably be synchronized with the PWM pulse rate. This ensures that the beginning of a PWM pulse begins e.g. with a rising clock edge. The controller 28 is designed in its transfer function $G_c(f)$ in such a way that the controlled variable 29 sets the frequency of the variable-frequency device 30 such that the difference between the digital PWM reference signal 16 and the output signal 23 of the amplifier device 20 becomes minimal.

The output signal 23 of the power stage 20 may be fed to a loudspeaker 32 directly or via a third filter device 31, such as for example a passive low-pass filter. Alternatively or in addition, the loudspeaker signal 33 may be filtered in a further filter device 26 and coupled in negatively at the summation device 25, and consequently be included in the control loop.

Figure 2:
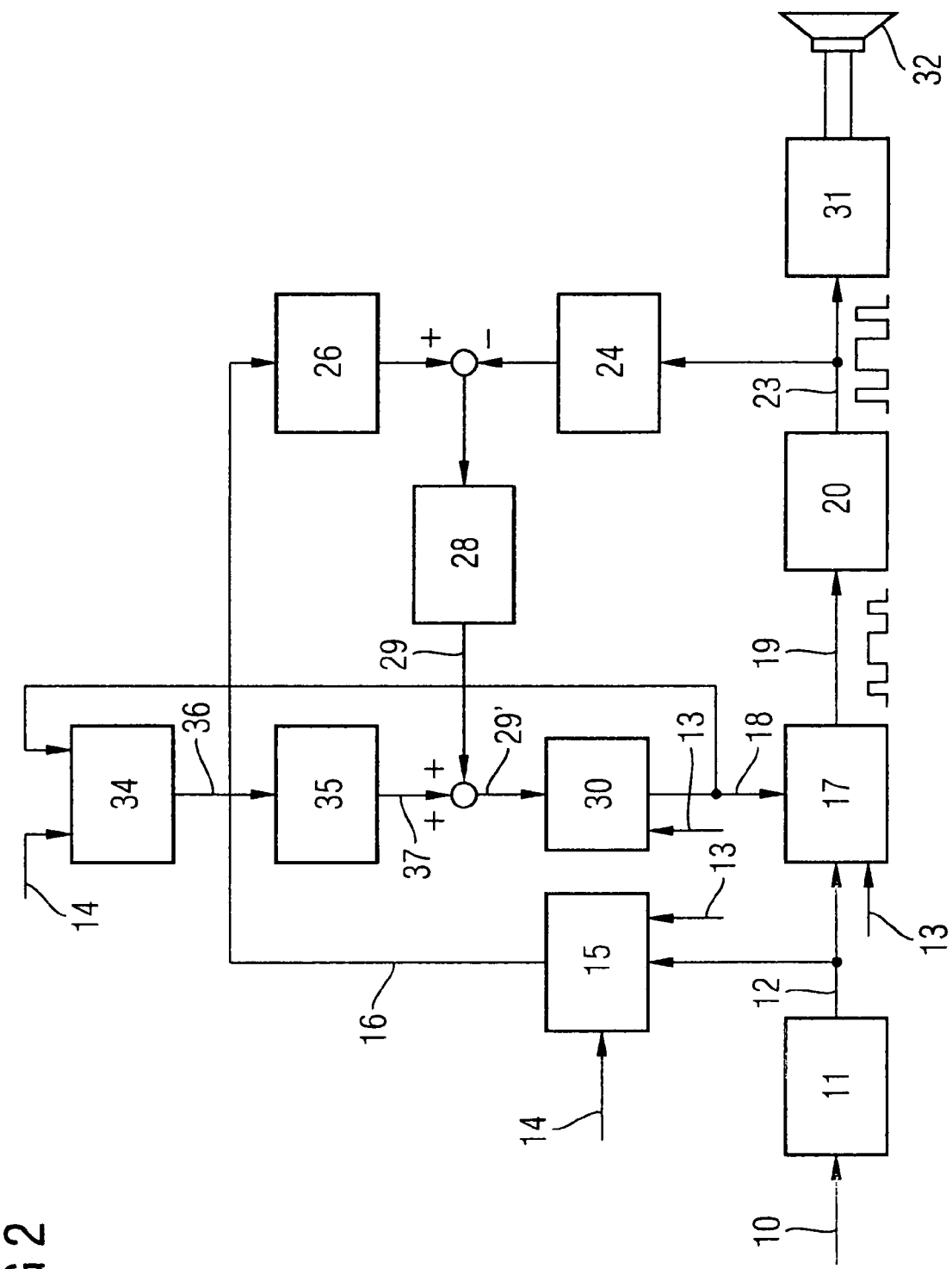
FIG. 2 shows a schematic block diagram of a control circuit to explain a second embodiment of the present invention.

In FIG. 2, a schematic block diagram is represented to explain a second embodiment of the present invention, which differs from the embodiment according to FIG. 1 in particular in that the variable-frequency device 30, in particular the VCO, is incorporated in a PLL (phase locked loop) with a phase detector 34 and a loop filter device 35 (loop filter). In the embodiment according to FIG. 2, the variable-frequency system clock 18 is fed to a phase detector 34, in which the variable-frequency system clock 18 is compared with the constant predetermined system clock 14, in order to detect a phase difference 36. This detected phase difference 36 is then fed to the loop filter 35, in order to be added to the controlled variable 29 to produce a modified controlled variable 29'.

To be independent of production tolerances and temperature influences, and at the same time to ensure a high sensitivity to small frequency changes, it is appropriate to use such a PLL structure according to FIG. 2 instead of a purely VCO structure according to FIG. 1. The reference frequency of the PLL is likewise the constant predetermined system clock 14, and consequently the power stage or amplifier unit 20 is driven with this reference signal 14 when the control is not active. The controlled variable 29 is added to a loop filter signal 37 at the end of the loop filter 35 or optionally also added to the phase difference 36 before the loop filter device 35 (not represented). Furthermore, there is the possibility of instead using a VCO with an extra modulation input. In the long term, the PLL circuit of course attempts to compensate for this frequency change. The dynamic properties and time constants of such a correcting process are determined by the transfer function F(s) of the loop filter 35 and can be used to play a part in the design of the controller 28.

Although the present invention has been described above on the basis of a digital class-D amplifier, it can also be transferred to any desired analog amplifiers. For example, reference is made to analog class-D amplifiers if the signal (19) to be amplified is in analog form. The invention may also be used in the case of such a type of amplifier. However, the effects of the present invention are particularly advantageous, in the case of purely digital amplifiers, i.e. if the signal in digital form is not converted into an analog signal by means of a D-A converter.

LIST OF REFERENCE NUMERALS

10 signal, preferably digital audio signal, e.g. PCM
11 signal processing device, e.g. digital circuit
12 PWM data, i.e. PWM information
13 PWM pulse rate, e.g. of the frequency 288 kHz
14 predetermined system clock, e.g. of the frequency 88.128 MHz
15 PWM modulator
16 reference signal
17 PWM modulator
18 variable-frequency system clock
19 digital PWM signal
20 amplifier device
21 supply voltage
22 reference potential, e.g. ground
23 amplified digital PWM signal
24 filter device, e.g. of the transfer function $G_0(f)$
25 summation device
26 filter device, e.g. of the transfer function $G_r(f)$
27 amplifier deviation
28 control device, e.g. of the transfer function $G_c(f)$
29 controlled variable
29' modified controlled variable
30 variable-frequency device, e.g. VCO
31 filter device, e.g. low-pass filter
32 acoustic sound transducer, in particular loudspeaker
33 loudspeaker signal
34 phase detector
35 loop filter, with transfer function F(s)
36 phase difference
37 loop filter signal

The invention claimed is:
1. A method for correcting signal distortions in an amplifier device, the method comprising:
producing the digital PWM reference signal from the PWM data in a first pulse width modulator, the first pulse width modulator being controlled with a predetermined system clock;

producing a digital PWM signal from the PWM data in a second pulse width modulator, the second pulse width modulator being controlled with a variable-frequency system clock;
amplifying the digital PWM signal;
determining an amplifier deviation from the digital PWM reference signal and an amplified digital PWM signal;
producing a controlled variable from the amplifier deviation in a control device;
feeding the controlled variable to a control input of a variable-frequency device; and
producing the variable-frequency system clock in the variable-frequency device,
wherein the first pulse width modulator and the second pulse width modulator are triggered at a predetermined PWM pulse rate.

2. The method as claimed in claim 1, further comprising:
producing the PWM data in such a way that with each clock of the predetermined PWM pulse rate, a quantized item of PWM information is calculated; and
further wherein the digital signal comprises a PCM-modulated digital audio signal.

3. The method as claimed in claim 1, wherein the variable-frequency device comprises one of a group consisting of a voltage controlled oscillator and a current controlled oscillator.

4. The method as claimed in claim 1, wherein the variable-frequency device is synchronized with the predetermined PWM pulse rate.

5. The method as claimed in claim 1, wherein at least one of a group consisting of the digital PWM reference signal and the amplified digital PWM signal passes through a filter device before the amplifier deviation is determined.

6. The method as claimed in claim 1, wherein the amplifier device comprises at least one of a group consisting of an H-bridge circuit and a class-D amplifier.

7. The method as claimed in claim 1, further comprising:
using the controlled variable to set a frequency of the variable-frequency device in such a way as to minimize a difference between the digital PWM reference signal and the amplified digital PWM signal.

8. The method as claimed in claim 1, further comprising:
feeding the amplified digital PWM signal to an acoustic sound transducer.

9. The method as claimed in claim 8, further comprising:
determining the amplifier deviation from the digital PWM reference signal and the amplified digital PWM signal using a loudspeaker signal.

10. The method as claimed in claim 1, further comprising:
comparing the variable-frequency system clock with the predetermined system clock in a phase detector;
determining a phase difference between the variable-frequency system clock and the predetermined system clock;
filtering the phase difference in a filter device; and
adding the filtered phase difference to the controlled variable to form a modified controlled variable.

11. The method as claimed in claim 10, further comprising:
filtering the modified controlled variable in an additional filter device; and
applying the filtered modified controlled variable to the control input of the variable-frequency device.

12. The method as claimed in claim 11, wherein the control input comprises a modulation input.

13. The method as claimed in claim 1, further comprising:
varying the frequency of the variable-frequency system clock continuously over time.

14. The method as claimed in claim 1, further comprising:
varying the frequency of the variable-frequency system clock at discrete times.

15. The method as claimed in claim 1, wherein the PWM data is produced form a digital signal in a digital circuit.

16. A device for correcting signal distortions in an amplifier circuit, the device comprising:
a first pulse width modulator triggered at a predetermined pulse rate and configured to produce a digital PWM reference signal from PWM data;
a second pulse width modulator triggered at the predetermined pulse rate and configured to produce a digital PWM signal from the PWM data, the second pulse width modulator being controlled with a variable-frequency system clock;
an amplifier device for configured to amplify the digital PWM signal;
a device configured to determine an amplifier deviation from the digital PWM reference signal and an amplified digital PWM signal; and
a variable-frequency device configured to produce the variable-frequency system clock based on the amplifier deviation.

17. The device of claim 16, further comprising:
a control device configured to produce a controlled variable from the amplifier deviation; and
wherein the variable-frequency device produces the variable-frequency system clock from the controlled variable.

18. The device of claim 16, further comprising a filter device for filtering at least one of a group consisting of the digital PWM reference signal and the amplified digital PWM signal before the amplifier deviation is determined.

19. The device of claim 16, further comprising:
a phase detector for comparing the variable-frequency system clock and the predetermined system clock in order to determine a phase difference, and
further wherein the phase difference is added to the controlled variable.

20. The device of claim 16, further wherein a frequency of the variable-frequency system clock is varied continuously over time.

* * * * *